(12) United States Patent
Yang et al.

(10) Patent No.: US 6,207,575 B1
(45) Date of Patent: *Mar. 27, 2001

(54) LOCAL INTERCONNECT ETCH CHARACTERIZATION USING AFM

(75) Inventors: Wenge Yang, Fremont; Bhanwar Sinjh, Morgan Hill, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/027,047

(22) Filed: Feb. 20, 1998

(51) Int. Cl.$^7$ ................................................. H01L 21/302
(52) U.S. Cl. ........................... 438/706; 438/723; 438/724
(58) Field of Search ................................. 438/689, 706, 438/723, 724; 364/490, 468

(56) References Cited

U.S. PATENT DOCUMENTS

| | | | |
|---|---|---|---|
| 5,382,795 | * 1/1995 | Bayer et al. | 250/306 |
| 5,420,796 | * 5/1995 | Weling et al. | 364/468 |
| 5,426,302 | 6/1995 | Marchman et al. | 250/306 |
| 5,489,774 | 2/1996 | Akamine et al. | 250/234 |
| 5,497,656 | * 3/1996 | Kado et al. | 73/105 |
| 5,517,027 | 5/1996 | Nakagawa et al. | 250/306 |
| 5,606,190 | * 2/1997 | Hofmann et al. | 257/316 |
| 5,621,652 | * 4/1997 | Eakin | 364/490 |
| 5,622,596 | * 4/1997 | Armacost et al. | 438/702 |
| 5,652,428 | 7/1997 | Nishioka et al. | 250/307 |

* cited by examiner

Primary Examiner—Benjamin L. Utech
Assistant Examiner—Kin-Chan Chen
(74) Attorney, Agent, or Firm—Renner, Otto, Boisselle & Sklar, LLP

(57) ABSTRACT

In one embodiment, the present invention relates to a method of processing a wafer including characterizing a local interconnect etch, involving the steps of etching a portion a wafer comprising at least one device thereon to form a local interconnect etched portion on the wafer, scanning the local interconnect etched portion of the wafer with an atomic force microscope having a flared probing tip, generating surface profile data of the local interconnect etched portion from the atomic force microscope, and characterizing the surface profile data. In another embodiment, the present invention relates to a method of determining whether or not a trenching phenomenon exists after performing a local interconnect etch, involving the steps of scanning a local interconnect etched portion of a wafer with an atomic force microscope having a flared probing tip, generating surface profile data of the local interconnect etched portion from the atomic force microscope, and assessing whether the surface profile data indicates that the trenching phenomenon exists within the local interconnect etched portion.

19 Claims, 2 Drawing Sheets

LOCAL INTERCONNECT ETCH CHARACTERIZATION USING AFM

TECHNICAL FIELD

The present invention generally relates to a method of processing a semiconductor including characterizing a local interconnect etch using an atomic force microscope (AFM). In particular, the present invention relates to a method of characterizing a local interconnect etch using an atomic force microscope which can generate a side wall surface profile of the etched area.

BACKGROUND OF THE INVENTION

There is a continuing trend to increase the number and speed of circuits on integrated circuit (IC) chips. As a result of this drive toward ultra large scale integration, the size of various features decreases thereby increasing the number of devices on a chip. In order to take advantage of a large number of devices and form them into a large number of circuits, it is necessary to interconnect various zones, regions, connections and electrodes on the semiconductor substrate. For example, it is often necessary to connect selectively gate electrodes to source/drain diffusions, gate electrodes together and source/drain regions together. Local interconnects provide electrical connections in these instances.

A local interconnect providing an electrical connection between a source/drain region and gate electrode is desirable because it improves circuit density. Such a local interconnect is also desirable because it increases flexibility in circuit design. However, there are problems associated with forming such a local interconnect.

For instance, during the oxide etch process, it is desired to etch a portion of an oxide layer thereby exposing an etch stop layer, typically a nitride layer deposited over the entire device. But the etching rate of nitride at a poly gate corner is markedly faster than the etching rate of nitride at the flat area. Consequently, the oxide etch process may undesirably etch the nitride layer at the poly gate corner leading to the exposure of the oxide spacer. Once the oxide spacer is exposed, the oxide etch process quickly removes the oxide spacer and in some instances a portion of an underlying oxide isolation region. This phenomenon is termed trenching and is illustrated in FIG. 1. The trenching phenomenon is a problem because it causes device failure.

Referring to FIG. 1, there is a wafer substrate 10 with at least one device 12, such as field effect transistor. Shown is poly gate 14 on the substrate 10 and a titanium silicide layer 16 over the poly gate 14. Also shown are oxide spacers 18 adjacent the poly gate 14, nitride etch stop layer 20 and oxide layer 22, which is etched away by an oxide etching process. FIG. 1 shows the unintended etching of the nitride etch stop layer 20 which leads to the undesirable formation of a trench 24. The trench 24 is characteristic of the problematic trenching phenomenon. At the poly gate corner 26, the etching rate of nitride layer 20 is faster than the etching rate of nitride at the flat area 28.

In order to prevent etching of the nitride etch stop layer and the consequent trenching phenomenon, testing procedures have been developed to monitor the progress of etch oxide process. Current testing procedures include destructive testing that involves dissecting the IC or subjecting the IC to excessive conditions to induce failure. Dissection and maximum tolerance testing are beneficial because they offer critical information about the internal construction, durability and projected lifespan of the IC. Additionally, due to the geometrical constraints of the etched local interconnect structure, destructive tests are required to measure the nitride etch stop layer at the poly gate corner.

Present destructive tests include dissecting a IC and viewing it with a scanning electron microscope (SEM), scanning tunneling microscope (STM) or similar apparatus. Moreover, there are destructive tests for determining maximum thermal stress and voltage breakdown of a IC. The thermal stress test is destructive because it measures maximum thermal stress until the IC fails. The voltage breakdown test is destructive because it measures input voltage until the IC dielectric breaks down and the IC short circuits.

In traditional IC manufacturing, when a fabrication run is made, several thousand or more ICs are produced. From that fabrication run, many ICs are sampled out from the production and identified for destructive testing. The destructive test examples given above are typical of the tests performed. The rationale is that a statistical sample will demonstrate characteristics analogous to each of the ICs produced in the fabrication run. Destructive testing, however, can only provide information about the devices actually tested. Thus, devices in the same fabrication run are assumed to be analogous to the sampled IC.

A drawback to present testing techniques is that testing is mostly performed after the IC fabrication is complete. This may result in unnecessarily finishing an IC that exhibits trenching characteristics. Destructive testing is also expensive. Moreover, in light of the trend from 200 mm wafers towards the use of 300 mm wafers, destructive testing is even more expensive.

What is needed is a nondestructive method of inspecting ICs during fabrication processing. By inspecting the wafers during intermediate IC fabrication steps, useful information can be obtained about the evolving wafer, and in particular the local interconnect etch process. Further, if these techniques are nondestructive, substantially more wafers or even every wafer can be tested and those meeting test criteria can be sent on for further fabrication while those not meeting test criteria can be either discarded or sent back for remedial action. In addition, the local interconnect etch process for subsequent wafers can be adjusted to avoid the problems identified by the testing of earlier processed wafers. An in-line nondestructive test directly promotes higher IC yield and longer IC life.

SUMMARY OF THE INVENTION

In one embodiment, the present invention relates to a method of processing a wafer including characterizing a local interconnect etch, involving the steps of etching a portion of a wafer comprising at least one device thereon to form a local interconnect etched portion on the wafer, scanning the local interconnect etched portion of the wafer with an atomic force microscope, generating surface profile data of the local interconnect etched portion from the atomic force microscope, and characterizing the surface profile data.

In another embodiment, the present invention relates to a method of determining whether or not a trenching phenomenon exists after performing a local interconnect etch, involving the steps of scanning a local interconnect etched portion of a wafer with an atomic force microscope having a flared probing tip, generating surface profile data of the local interconnect etched portion from the atomic force microscope, and assessing whether the surface profile data indicates that the trenching phenomenon exists within the local interconnect etched portion.

In yet another embodiment, the present invention relates to a method of determining a value of poly gate corner selectivity after performing a local interconnect oxide etch and nitride etch on a wafer, involving the steps of scanning a local interconnect etched portion of the wafer with an atomic force microscope having a flared probing tip, generating surface profile data of the local interconnect etched portion from the atomic force microscope, and calculating the value of corner selectivity S based on certain equations.

As a result of the present invention, an in-line, nondestructive inspection method applicable for a local interconnect etch process is provided. The present invention reduces process development and manufacturing control costs while increasing the accuracy and the amount of etch process data. Notably, the present invention can provide data relative to poly gate spacer depth and width after a local interconnect etch process. This information is a quantitative measurement of the local interconnect etch selectivity at one of the most critical areas, the poly gate corner.

DETAILED DESCRIPTION OF THE INVENTION

Figure 1:
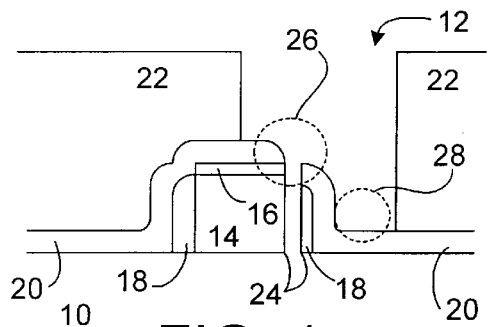
FIG. 1 is a cross-section diagram illustrating the trenching phenomenon.

Generally when forming a local interconnect, a portion of an oxide layer, such as a tetraethylorthosilicate based oxide, covering various devices and layers is etched to form a contact hole or recess line, typically partially exposing a transistor. It may be necessary to etch additional layers (such as a nitride layer) to form the contact hole or recess line, or partially expose a transistor. The local interconnect is then formed in either the contact hole or recess line forming an electrical connection between desired components or regions.

The present invention relates to an in-line method of inspecting a wafer after local interconnect etching steps in an IC fabrication process. In particular, a local interconnect etch characterization is performed in order to determine the quality of the evolving wafer and the quality of the fabrication process, and in particular, the quality of an oxide etch process and/or nitride etch process. This inspection or characterization is performed by employing an atomic force microscope (AFM) to scan a predetermined region of the wafer. The predetermined region is an area of the wafer subjected to an oxide etch process and/or nitride etch process. Predetermined regions generally include local interconnect recess lines (trench lines), local interconnect contact holes, and poly gate corners.

An AFM is a device utilizing a stylus mounted on a cantilever. A sample, such as a semiconductor wafer undergoing processing, is placed under the stylus and the sample is moved in two dimensions (X and Y). A sensing device determines the position of the stylus (third dimension, Z) with respect to the two dimensional position of the sample. Thus, by moving the sample under the AFM stylus, three dimensional data can be recorded. This results in the ability to record and calculate statistically important parameters with respect to each sample.

The AFM can observe the three dimensional shape of a surface of a sample by bringing the probing tip near the surface of the sample. The surface of the sample is scanned in the X-Y plane while adjusting level Z of the sample thereby keeping the forces exerted between the sample and the probing tip constant and monitoring Z axis control signals fed in the scanning operation.

A computer controls the AFM, gathers data from the AFM and processes the data according to a predetermined procedure. Examples of such procedures include procedures for determining surface profile features including maximum depth, maximum height, average height, minimum width, average width, maximum width, standard deviation of the surface roughness, the presence of the trenching phenomenon, corner selectivity and overall roughness. These procedures can be used to generate surface profile data, and particularly side wall surface profile data of the etched portion of a wafer including recess lines, contact holes and poly gate corners. Information gained from these procedures is relevant to the wafer fabrication process. Further, collected data serves to quantify the inspection procedures and directly serves to improve the quality of the fabrication process. After the procedures are performed, the computer can generate a signal to indicate whether the wafer should continue to be processed, returned to a prior step for remedial action or discarded.

Figure 2:
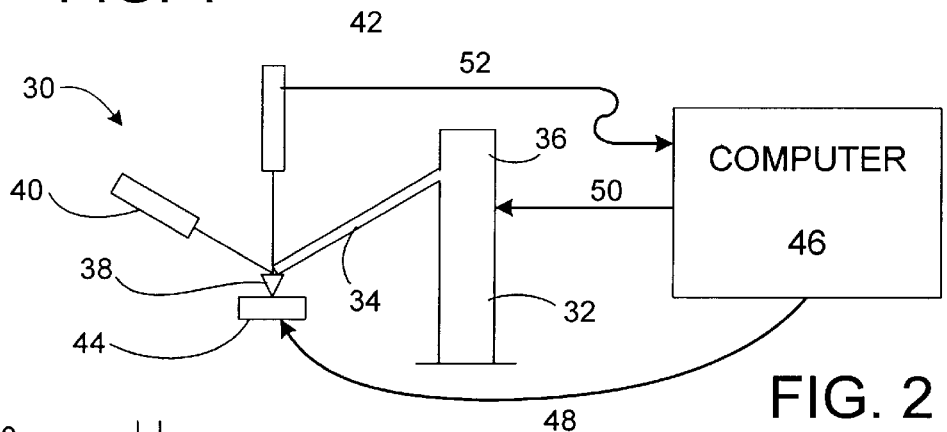
FIG. 2 is a diagram illustrating an AFM inspecting a local interconnect etched wafer in accordance with the present invention.

After performing an oxide and/or nitride etch step in a process for making a local interconnect between a source/drain region and a poly gate, the resulting etched area is inspected to determine its characteristics. Referring to FIG. 2, the etched area is scanned by an AFM to gather data representing the surface morphology of a local interconnect recess line or contact hole. FIG. 2 illustrates an atomic force microscope 30 having a base 32, cantilever 34, cantilever support 36, stylus 38 including a probing tip (not shown), emitter 40 and cantilever position sensor 42. Emitter 40 typically emits light that is reflected from the cantilever and received by the sensor to determine the stylus position. A sample wafer 44 is affixed to base 32 and placed under stylus 38 for inspection. FIG. 2 also shows a computer 46 used to control the AFM 30 and to collect measurement data.

The base is a platform holding the sample and moveable in two directions; for example, moveable in the X-Y plane. This can be accomplished by using a piezoelectric scanner. A piezoelectric scanner is a device employing electrically sensitive material to induce movement of the sample in the X-Y plane based on an electrical input. An example of an electrically sensitive material is quartz. The electrical input is delivered from computer 46 to base 32 via communication line 48. A predetermined region, such as a recess or hole formed by an etch process, is selected for inspection. The selected region can include several etched areas of the wafer.

The cantilever is moveable in one direction; for example, moveable in the Z direction. The cantilever forms a spring that holds the stylus in position against the sample. Measurement of the stylus position is accomplished by adding a fine measurement of the cantilever position to a rough position value. The rough cantilever position is determined by the cantilever support's current vertical setting. The cantilever support 36 is adjusted by the computer 46 via communication line 50 until the probing tip of the stylus 38 is above or within a local interconnect recess line or local interconnect contact hole of sample 44. There is a fine measurement performed by emitter 40 and sensor 42; the sensor detects the position of the cantilever reflected light ray as the sample is moved under the stylus. The data from sensor 42 is transmitted to the computer via communication line 52. The resolution of the Z position data is typically 1 Angstrom (1 Å) or better using currently available atomic force microscopes and cantilevers.

Computer 46 receives Z position data from the AFM over communication line 52. This data is collected and stored in the memory along with data representing the X and Y positions corresponding to Z position data values. Data analysis procedures are performed on the collected data by computer 46. The data analysis procedures include roughness procedures, height procedures, depth procedures, width procedures, side wall configuration procedures, trench phenomenon procedures and peak to valley procedures, among other procedures.

Information gained from these procedures is important to the wafer fabrication process. Side wall morphology, for example, is an important feature of integrated circuit fabrication, and local interconnect fabrication in particular. Side wall morphology can detect the undesirable trenching phenomenon, susceptibility to electrical shorts within devices, minimum overetch time to prevent residues, filaments and etching of the etch stop layer, and interconnect reliability. This information serves to quantify the inspection and directly serves to improve the quality of the local interconnect fabrication process.

Inspection of contact holes and recess lines is more difficult than mere inspection of a flat surface. The probing tip of the AFM must be small enough to be positioned within a contact hole or a recess line. In one embodiment, the probing tip is about 0.15 μm in width at the end and 1 μm in length. This enables accurate scanning of contact holes and recess lines as narrow as 0.18 μm and just over 1 μm deep. In a preferred embodiment, the end of the probing tip is flared to facilitate scanning, profiling and accurate measurement of the side wall morphology. A flared probing tip thus provides scanning results for the X, Y and Z planes. Examples of such probing tips include those under the general trade designation "CD" of the SXM Tip Series available from IBM Deutschland Entwicklung GmbH.

Figure 3:
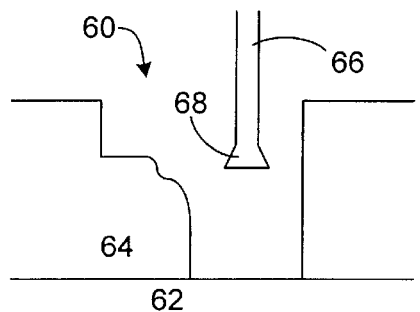
FIG. 3 is a diagram illustrating the probing tip of an AFM inspecting a local interconnect etched recess of a wafer in accordance with the present invention.

Referring to FIG. 3, an oxide and nitride etched recess line 60 is shown on a wafer 62 having at least one device 64 thereon. A probing tip 66 of an AFM (not entirely shown) enters recess line 60 in order to scan the etched area. Using a probing tip having a flared end 68 facilitates scanning, profiling and accurate measurement of the side wall morphology so that an accurate profile of the etched area may be generated by a computer.

Figure 4:
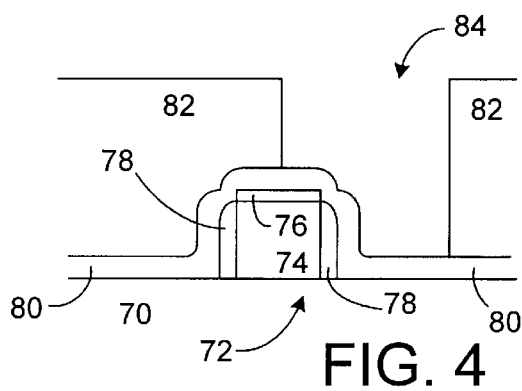
FIG. 4 is a cross-section diagram illustrating a device on a wafer after a local interconnect oxide etch process in accordance with the present invention.

The scanning or inspection using AFM having a flared probing tip can be conducted after an oxide etch process or nitride etch process or both processes. Referring to FIG. 4, a wafer 70 having at least one device 72 thereon, such as field effect transistor, is shown after an oxide etch process has been performed. Titanium silicide layer 76 overlies a poly gate 74, beside which are oxide spacers 78. A nitride layer 80 overlies the wafer 70 and device 72. A selective portion of oxide layer 82, typically tetraethylorthosilicate based oxide, has been etched to form a local interconnect recess line 84. FIG. 4 shows the results of an acceptable oxide etch process. An AFM scan and analysis after the oxide etch process can generate data which confirms that an acceptable oxide etch process has been performed.

Figure 5:
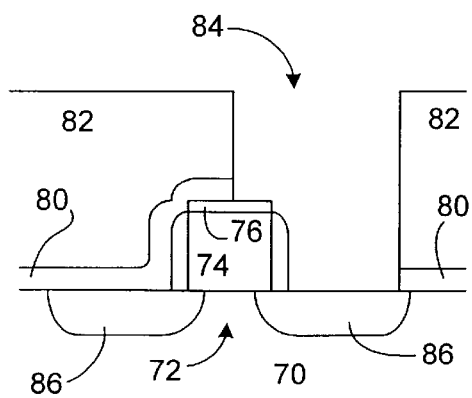
FIG. 5 is a cross-section diagram illustrating a device on a wafer after a local interconnect nitride etch process in accordance with the present invention.

Referring to FIG. 5, wafer 70 of FIG. 4 is shown after a nitride etch process has been performed. Reference numerals of like elements remain the same as used in FIG. 4. The wafer 70 of FIG. 5 is the same as the wafer 70 of FIG. 4 except that nitride layer 80 in local interconnect recess line 84 has been etched via a nitride etching process. Source and drain regions 86 are also shown. An AFM scan and analysis after the nitride etch process can generate data which confirms that an acceptable nitride etch process has been performed. After acceptable oxide and nitride etching processes have been performed, a source/drain may be electrically connected with the poly gate thereby forming a local interconnect (not shown) in recess line 84 using conventional techniques.

The purpose of testing or inspecting the wafer after a local interconnect etching step is to determine and evaluate the characteristics of the side wall features, such as the presence or size of oxide spacers and the existence of the trenching phenomenon. Typically, existence of the trenching phenomenon is indicative of a poor quality local interconnect etch process. Furthermore, extensive etching at the poly gate corner, especially extensive etching of the nitride etch stop layer at the poly gate corner, indicates that a poor quality local interconnect etch process may have been performed.

Figure 6:
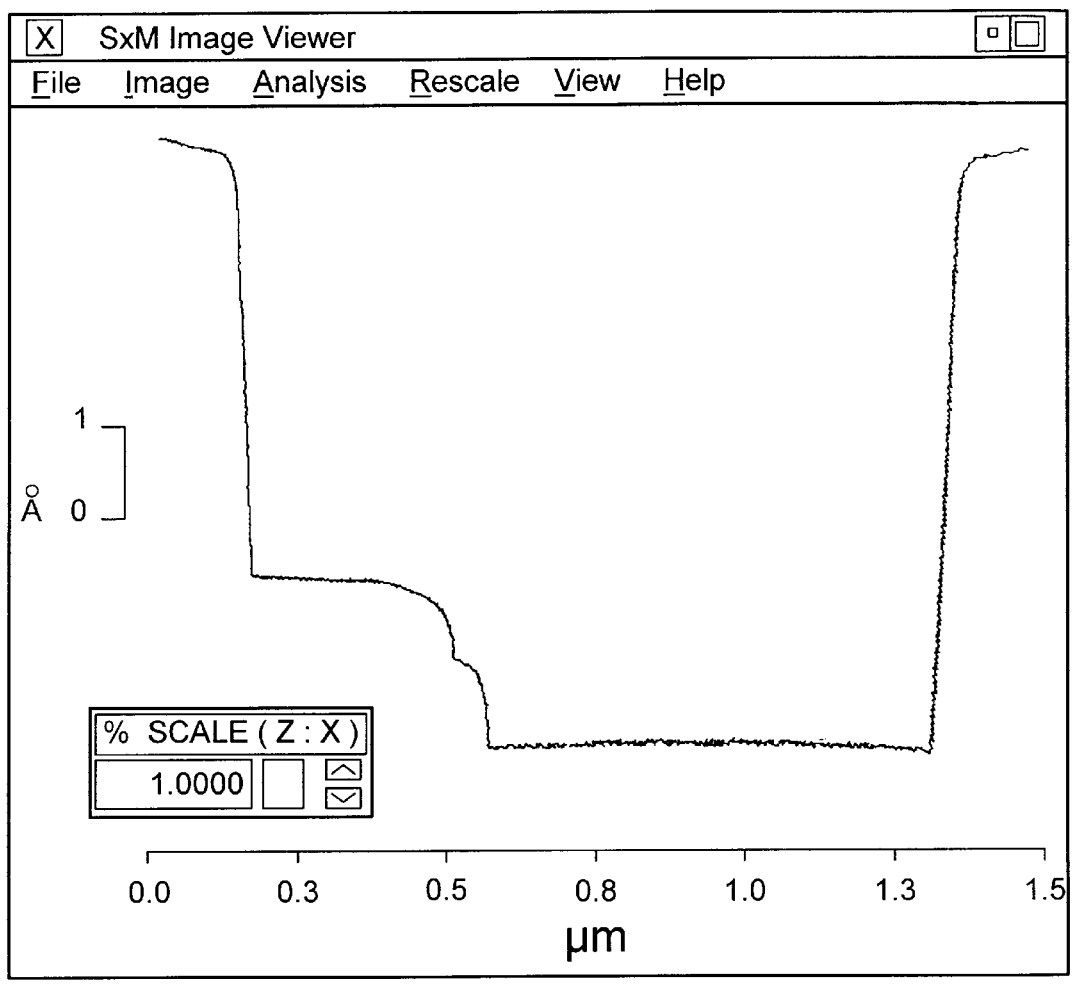
FIG. 6 is an example of a computer generated profile of recess line of a wafer using and AFM having a flared probing tip after an oxide etch process and a nitride etch process in accordance with the present invention.

Once the inspection including scanning and data analysis procedures have been performed, a profile illustrating the surface morphology of a local interconnect contact hole or recess line can be generated by a computer. The profile can be used to characterize the etched portion of the wafer as acceptable or unacceptable, and if unacceptable, whether the wafer can be further etched (remedial action) or discarded. An example of a profile of local interconnect recess line is illustrated in FIG. 6. FIG. 6 indicates that an acceptable local interconnect etch process has been performed as an oxide spacer is present evidenced by the curves in the lower left portion of the graph.

If the wafer is not properly etched for any reason including insufficient etching as well as the existence of the trenching phenomenon, the oxide etched wafer can either be remedially attended to or discarded. A remedial step can involve controlled re-etching in an attempt to remove desired oxide portions fully exposing the etch stop layer without etching therethrough or removing the nitride layer without damage to the oxide spacers. This can be performed if the etch process conditions have been improperly controlled, for example. If the wafer is properly etched, the wafer is ideally suited for further processing and an inspection procedure executed on gathered AFM data confirms that the local interconnect may be completed using known procedures. Specifically, a local interconnect electrically connecting a source/drain region and a poly gate is then formed.

In one embodiment, determining whether a proper or improper (acceptable or unacceptable) local interconnect etch process has been performed can be made by an operator viewing an operator interface. For example, the operator interface may have a monitor and keyboard. The operator can then observe an electronic image of surface morphology (etch surface profile) and control the local interconnect etch process. Depending upon the infonmation sent to the monitor in connection with the local interconnect etch process, the operator can instruct the etching process to continue, discard the wafer or send the wafer back for remedial processing. In any event, the result is an improved in-line fabrication process that gains higher yield and improved device reliability.

In another embodiment, determining whether a proper or improper (acceptable or unacceptable) local interconnect etch process has been performed can be made by a computer. For example, the computer may compare gathered information to predetermined standard parameters. The computer can then control, if necessary, the local interconnect etch process. In this embodiment, if the gathered information satisfies predetenmined standard parameters, the local interconnect fabrication process continues; and if the gathered information does not satisfy predetermined standard parameters, the fabrication process either discards the wafer or implements remedial action.

Figure 7:
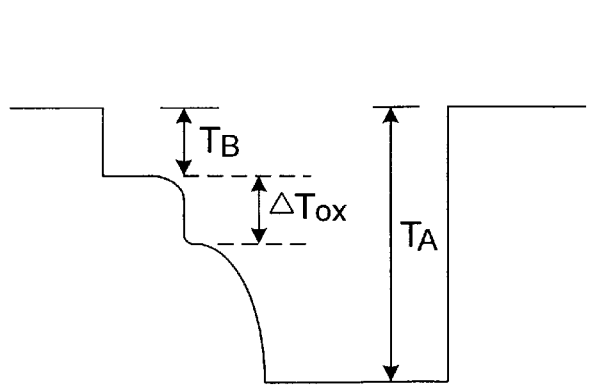
FIG. 7 illustrates the parameters required in order to calculate corner selectivity S in accordance with the present invention.

In another embodiment, detennining whether a proper or improper (acceptable or unacceptable) local interconnect etch process has been performed can be made by performing calculations in connection with the etch profile generated (such as the profile illustrated in FIG. 3). In particular, referring to FIG. 7, corner selectivity S can be calculated using the equation:

$$S = \frac{T_{ox} - T_1}{N_{loss}}$$

wherein $T_{ox} = T_A - T_{nitride\ thickness}$ $T_1 = T_B - T_{nitride\ thickness}$ and $ER_{ox}$ is the oxide etch rate during the nitride etch process; $ER_{nit}$ is the nitride etch rate $$N_{loss} = T_{nitride\ thickness} - \left[t - \frac{\Delta T_{ox}}{ER_{ox}}\right] ER_{nit}$$

during the nitride etch process; $\Delta T_{ox}$ is the oxide loss at the oxide spacer during nitride etch; $T_{nitride\ thickness}$ is the thickness of the nitride layer; t is the total nitride etch time; and $T_A$, $T_B$ and $\Delta T_{ox}$ are measured by AFM (particularly the AFM generated profile). The corner selectivity S calculation evaluates the amount of oxide of an oxide spacer etched after an oxide and nitride etch process are performed. Corner selectivity is an important parameter in measuring, characterizing and evaluating local interconnect etching.

Figure 8:
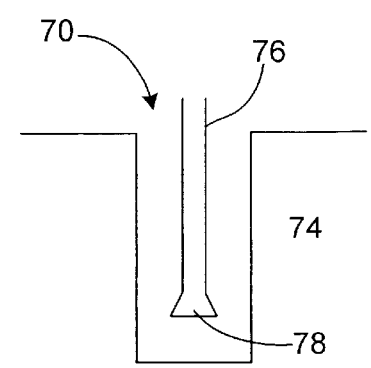
FIG. 8 is a diagram illustrating the probing tip of an AFM inspecting a contact hole of a wafer in accordance with the present invention.

Referring to FIG. 8, a contact hole 70 is shown on a wafer 72 with an oxide layer 74 thereover. Although various devices and/or layers may exist on the wafer 72 and below the oxide layer 74, they are not shown for simplicity. A probing tip 76 of an AFM (not entirely shown) enters contact hole 70 in order to scan the etched area (contact hole). Using a probing tip having a flared end 78 facilitates scanning, profiling and accurate measurement of the side wall morphology so that an accurate profile of the etched area may be generated by a computer. The scanning or inspection using AFM having a flared probing tip can be conducted after an oxide etch process is performed to make the contact hole. An AFM scan and analysis after the etch process can generate data which confirms that an acceptable contact hole has been made.

The methods of the present invention permit the determination of an etching rate for each etched portion of a wafer, which in turn, permits the determination of processing windows (such as the maximum and minimum etch times needed for any given etched portion) required to generate an acceptable product having different local interconnect areas. For example, since relatively large openings generally etch at a faster rate than relatively small openings, processing windows permitting the acceptable, simultaneous etching of recess lines (relatively large openings) and contact holes (relatively small openings) can be determined in accordance with the present invention.

The characterization and inspection of a local interconnect etched portion has been described with specific reference to forming a local interconnect between the source/drain region and the poly gate of a single device; however, the methods of the present invention may be used to characterize and inspect local interconnect etched portions for local interconnects between gate electrodes of different devices, source/drain regions of different devices, and various combinations thereof. Moreover, although the characterization and inspection of a local interconnect etched portion has been described with specific reference to a field effect transistor, the methods of the present invention may be used to characterize and inspect local interconnect etched portions associated with any device or region.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a wafer including characterizing a local interconnect etch as acceptable or unacceptable, comprising:

etching a portion of a wafer comprising at least one device thereon to form a local interconnect etched portion on the wafer;

scanning the local interconnect etched portion of the wafer with an atomic force microscope;

generating surface profile data including sidewall profile data of the local interconnect etched portion from the atomic force microscope;

evaluating the surface profile data to determine whether the surface profile data indicates the presence of a trenching phenomenon and etching through an etch stop layer; and further processing of the wafer if both the trenching phenomenon and the etching through an etch stop layer are not present or reprocessing or discarding the wafer if either the trenching phenomenon or the etching through an etch stop layer are present.

2. The method of processing a semiconductor including characterizing a local interconnect etch according to claim 1, further comprising forming a local interconnect in the local interconnect etched portion.

3. The method of processing a semiconductor including characterizing a local interconnect etch according to claim 2, wherein the local interconnect is an electrical connection between a source/drain region and a poly gate of the device.

4. The method of processing a semiconductor including characterizing a local interconnect etch according to claim 1, further comprising discarding the wafer.

5. The method of processing a semiconductor including characterizing a local interconnect etch according to claim 1, further comprising re-etching the local interconnect etched portion the wafer.

6. The method of processing a semiconductor including characterizing a local interconnect etch according to claim 1, wherein the local interconnect etched portion is at least one of a contact hole and a recess line.

7. The method of processing a semiconductor including characterizing a local interconnect etch according to claim 1, wherein the device is a field effect transistor device.

8. The method of processing a semiconductor including characterizing a local interconnect etch according to claim 1, wherein characterizing the surface profile data comprises at least one of:

determining whether or not a trenching phenomenon exists; and calculating corner selectivity.

9. The method of processing a semiconductor including characterizing a local interconnect etch according to claim 1, wherein the etching step is an oxide etching step.

10. The method of processing a semiconductor including characterizing a local interconnect etch according to claim 1, wherein the etching step is a nitride etching step.

11. The method of processing a semiconductor including characterizing a local interconnect etch according to claim 1, wherein the atomic force microscope employs a probing tip having a flared end.

12. A method of determining presence of a trenching phenomenon after performing a local interconnect etch, comprising:

scanning a local interconnect etched portion of a wafer with an atomic force microscope having a flared probing tip;

generating surface profile data including sidewall profile data of the local interconnect etched portion from the atomic force microscope; and evaluating the generated surface profile data including sidewall profile data of the local interconnect etched portion to determine whether the surface profile data indicates the presence of the trenching phenomenon within the local interconnect etched portion, and further processing the wafer if the trenching phenomenon is not present or reprocessing or discarding the wafer if the trenching phenomenon is present.

13. The method of determining whether or not a trenching phenomenon exists after performing a local interconnect etch according to claim 12, wherein the trenching phenomenon exists between an oxide spacer and a poly gate of a field effect transistor.

14. The method of determining whether or not a trenching phenomenon exists after performing a local interconnect etch according to claim 12, wherein the local interconnect etched portion is at least one of a contact hole and a recess line.

15. The method of determining whether or not a trenching phenomenon exists after performing a local interconnect etch according to claim 12, wherein the local interconnect etched portion is formed by an oxide etching step.

16. The method of determining whether or not a trenching phenomenon exists after performing a local interconnect etch according to claim 12, wherein the local interconnect etched portion is formed by a nitride etching step.

17. A method of determining a value of poly gate corner selectivity after performing a local interconnect oxide etch and nitride etch on a wafer, comprising:

scanning a local interconnect etched portion of the wafer with an atomic force microscope having a flared probing tip;

generating surface profile data including sidewall profile data of the local interconnect etched portion from the atomic force microscope;

calculating the value of corner selectivity S based on equations $$S = \frac{T_{ox} - T_1}{N_{loss}}$$

wherein $T_{ox} = T_A - T_{nitride\ thickness}$ $T_1 = T_B - T_{nitride\ thickness}$ $$N_{loss} = T_{nitride\ thickness} - \left[t - \frac{\Delta T_{ox}}{ER_{ox}}\right] ER_{nit}$$

and $ER_{ox}$ is an oxide etch rate during the nitride etch; $ER_{nit}$ is a nitride etch rate during the nitride etch; $\Delta T_{ox}$ is the oxide loss at an oxide spacer during the nitride etch; $T_{nitride\ thickness}$ is the thickness of the nitride layer; t is a total nitride etch time; and $T_A$, $T_B$ and $\Delta T_{ox}$ are measured by the atomic force microscope; and further processing the wafer if the corner selectivity S indicates etching of the oxide spacer does not exceed an amount or reprocessing or discarding of the wafer if the corner selectivity S indicates etching of the oxide spacer exceeds an amount, based on the calculated value of corner selectivity S.

18. The method of determining a value of poly gate corner selectivity after performing a local interconnect oxide etch and nitride etch on a wafer according to claim 17, wherein local interconnect etched portion of the wafer is adjacent a field effect transistor.

19. The method of determining a value of poly gate corner selectivity after performing a local interconnect oxide etch and nitride etch on a wafer according to claim 17, wherein the local interconnect etched portion is at least one of a contact hole and a recess line.

* * * * *

UNITED STATES PATENT AND TRADEMARK OFFICE
CERTIFICATE OF CORRECTION

PATENT NO.    : 6,207,575 B1
DATED         : March 27, 2001
INVENTOR(S)   : Wenge Yang, et al.

It is certified that error appears in the above-identified patent and that said Letters Patent is hereby corrected as shown below:

<u>Column 7,</u>
Line 6, replace "the infonmation sent" with -- the information sent --.
Line 25, replace "detennining whether" with -- determining whether --.

Signed and Sealed this

Sixteenth Day of October, 2001

*Attest:*

NICHOLAS P. GODICI
*Attesting Officer    Acting Director of the United States Patent and Trademark Office*